US012676492B2

(12) United States Patent　　(10) Patent No.:　US 12,676,492 B2
Ma　　(45) Date of Patent:　Jul. 7, 2026

(54) CONNECTOR FOR ELECTRONIC DEVICES AND POWER SUPPLY CONTROL METHOD APPLIED TO THE CONNECTOR

(71) Applicant: MATRIXED REALITY TECHNOLOGY CO., LTD., Wuxi (CN)

(72) Inventor: Yue Ma, Beijing (CN)

(73) Assignee: MATRIXED REALITY TECHNOLOGY CO., LTD., Wuxi (CN)

( * ) Notice: Subject to any disclaimer, the term of this patent is extended or adjusted under 35 U.S.C. 154(b) by 71 days.

(21) Appl. No.: 18/565,087

(22) PCT Filed: May 31, 2022

(86) PCT No.: PCT/CN2022/096136
§ 371 (c)(1),
(2) Date: Nov. 29, 2023

(87) PCT Pub. No.: WO2022/253207
PCT Pub. Date: Dec. 8, 2022

(65) Prior Publication Data
US 2024/0291285 A1　　Aug. 29, 2024

(30) Foreign Application Priority Data

Jun. 1, 2021　(CN) ......................... 202110609459.1

(51) Int. Cl.
H02J 7/50　　(2026.01)
G06F 13/362　(2006.01)
H03L 7/08　　(2006.01)

(52) U.S. Cl.
CPC .............. H02J 7/50 (2026.01); G06F 13/362 (2013.01); H03L 7/0807 (2013.01)

(58) Field of Classification Search
CPC ...................................................... H02J 7/0013
(Continued)

(56) References Cited

U.S. PATENT DOCUMENTS

2016/0170914 A1*　6/2016　Pethe ................. G06F 13/4022
　　　　　　　　　　　　　　　　　　　　　710/20
2016/0218527 A1　　7/2016　Liao
(Continued)

FOREIGN PATENT DOCUMENTS

CN　　107706972 A　　2/2018
CN　　108418582 A　　8/2018
(Continued)

OTHER PUBLICATIONS

International Search Report received in the corresponding International Application PCT/CN2022/096136, mailed Aug. 3, 2022.
(Continued)

*Primary Examiner* — Titus Wong
(74) *Attorney, Agent, or Firm* — K&L Gates LLP

(57) ABSTRACT

Embodiments of the present disclosure provide a connector. The connector includes first to third interfaces, a switch circuit, a power supply device control circuit, and an interface control circuit. The first to third interfaces are configured to connect a host device, an upstream facing port (UFP) device and a power supply device, respectively. The switch circuit is connected to the first interface, the second interface, the third interface, and the interface control circuit. The power supply device control circuit is connected to the third interface and the interface control circuit. In response to detecting that a power supply device is plugged into the third interface, the power supply device control circuit detects a supply output power of the power supply device and determines a power supply control command based on the supply output power, a required charging power for the host device,
(Continued)

Connector
100 and an operating power of the slave device. The interface control circuit performs on-off control on the switch circuit according to the power supply control command, to control power supply from the power supply device to the host device and the slave device. Using the connector, efficient power supply from the external power supply device to the host device and the slave device can be implemented.

20 Claims, 9 Drawing Sheets

(58) Field of Classification Search
USPC ......................................................... 710/110
See application file for complete search history.

(56) References Cited

U.S. PATENT DOCUMENTS

| 2017/0222459 | A1* | 8/2017 | Kang ..................... H02J 7/0042 |
| 2019/0065423 | A1* | 2/2019 | Kadgi ..................... G06F 1/266 |
| 2020/0287403 | A1 | 9/2020 | Liu et al. |
| 2021/0083500 | A1 | 3/2021 | Quek et al. |
| 2021/0249826 | A1* | 8/2021 | Sun ..................... H01R 13/7039 |
| 2021/0382845 | A1* | 12/2021 | Lim ................. H04N 21/43637 |
| 2022/0004238 | A1 | 1/2022 | Sun |

FOREIGN PATENT DOCUMENTS

| CN | 108899962 | A | 11/2018 |
| CN | 110137755 | A | 8/2019 |
| CN | 209881017 | U | 12/2019 |
| CN | 111064243 | A | 4/2020 |
| CN | 111129891 | A | 5/2020 |
| CN | 113300423 | A | 8/2021 |
| CN | 216530587 | U | 5/2022 |

OTHER PUBLICATIONS

First office action received in the corresponding Chinese Application 202110609459.1, mailed Sep. 11, 2023.
Third OA received in CN Application No. 202110609459.1; mailed Aug. 12, 2024.
Search Report received in EP Application No. 22815252.6; mailed Aug. 26, 2024.

* cited by examiner

CONNECTOR FOR ELECTRONIC DEVICES AND POWER SUPPLY CONTROL METHOD APPLIED TO THE CONNECTOR

CROSS-REFERENCE TO RELATED APPLICATIONS

The present application is a national phase entry under 35 USC § 371 of International Application PCT/CN2022/096136, filed on May 31, 2022, which claims the benefit of and priority to Chinese Patent Application No. 202110609459.1, filed on Jun. 1, 2021, the entire disclosures of which are incorporated herein by reference.

TECHNICAL FIELD

Embodiments of the present disclosure relate to the field of connectors, and in particular, to a connector and a power supply control method applied to a connector.

BACKGROUND

In some application scenarios, a host device needs to work collaboratively with one or more host devices to accomplish an expected task. In such an application scenario, a host device acts as a downstream facing port (DFP) device, and a slave device acts as an upstream facing port (UFP) device. The DFP device has data processing capability; and can provide content outputs, e.g., data processing results, contents to be presented, etc., to the UFP device. The DFP device also has power supply capability, and can supply power to other device such as the UFP device. In addition, the host device may also act as a UFP device and be powered or charged by other power supply device. Examples of host device may include cell phones, computers, intelligent terminal devices, and the like. The UFP device itself does not have power supply capability, and needs to obtain a supply power from, for example, the DFP device or other power supply device before starting operation. Examples of the UFP device may include virtual reality devices, augmented reality devices, and the like, e.g., AR glasses, and the like.

In the case where a host device works coordinately with a plurality of slave devices, the host device needs to utilize its own power supply capability to maintain its operation to provide content outputs for the slave devices, and at the same time supply power to the slave devices to maintain the operation of the slave devices, which results in large power consumption of the host device, thus greatly limiting the endurance of the host device.

SUMMARY

In view of the above problems, embodiments of the present disclosure provide a connector and a power supply control method applied to a connector. Using the connector, efficient power supply from an external power supply device to a host device and a slave device can be implemented.

According to an aspect of embodiments of the present disclosure, there is provided a connector, which includes: a first interface configured to connect a host device: a second interface configured to connect a slave device: a third connector configured to connect a power supply device: a switch circuit connected to the first interface, the second interface and the third interface; a power supply device control circuit connected to the third interface, and configured to detect a supply output power of the power supply device and determine a power supply control command of the power supply device for the host device and the slave device based on the supply output power, a required charging power for the host device, and an operating power of the slave device, in response to detecting that the power supply device is plugged into the third interface; and an interface control circuit connected to the switch circuit and the power supply device control circuit, and configured to, in response to receiving the power supply control command from the power supply device control circuit, perform on-off control on the switch circuit according to the power supply control command, to control power supply from the power supply device to the host device and the slave device.

According to another aspect of embodiments of the present disclosure, there is provided a power supply control method applied to a connector, the connector including a first interface configured to connect a host device, a second interface configured to connect a slave device, and a third interface configured to connect a power supply device, a switch circuit connected to the first interface, the second interface, and the third interface, a power supply device control circuit connected to the third interface, and an interface control circuit connected to the switch circuit and the power supply device control circuit, the method including: at the power supply device control circuit, in response to detecting that the power supply device is plugged into the third interface, detecting a supply output power of the power supply device: determining a power supply control command of the power supply device for the host device and the slave device based on the supply output power, a required charging power for the host device, and an operating power of the slave device; and sending the power supply control command to the interface control circuit; and at the interface control circuit, in response to receiving the power supply control command, perform on-off control on the switch circuit according to the power supply control command, to control power supply from the power supply device to the host device and the slave device.

According to another aspect of embodiments of the present disclosure, there is provided an electronic device, which includes: at least one processor, a memory; and a computer program stored in the memory, wherein the at least one processor executes the computer program to implement the power supply control method applied to a connector as described above.

According to another aspect of embodiments of the present disclosure, there is provided a computer-readable storage medium configured to store a computer program, wherein the computer program, when executed by a processor, implements the power supply control method applied to a connector as described above.

According to another aspect of embodiments of the present disclosure, there is provided a computer program product including a computer program, wherein the computer program, when executed by a processor, implements the power supply control method applied to a connector as described above.

BRIEF DESCRIPTION OF THE DRAWINGS

Further understanding of the essence and advantages of embodiments of the present disclosure can be achieved by referring to the following accompanying drawings. In the appended figures, similar components or features may have the same reference label. The accompanying drawings are used to provide further understanding of the embodiments of the present invention and form part of the specification, and are used, together with the following detailed description of the embodiments, for explaining the embodiments of the present disclosure, but do not limit the embodiments of the present disclosure.

DETAILED DESCRIPTION

Figures 1, 2:
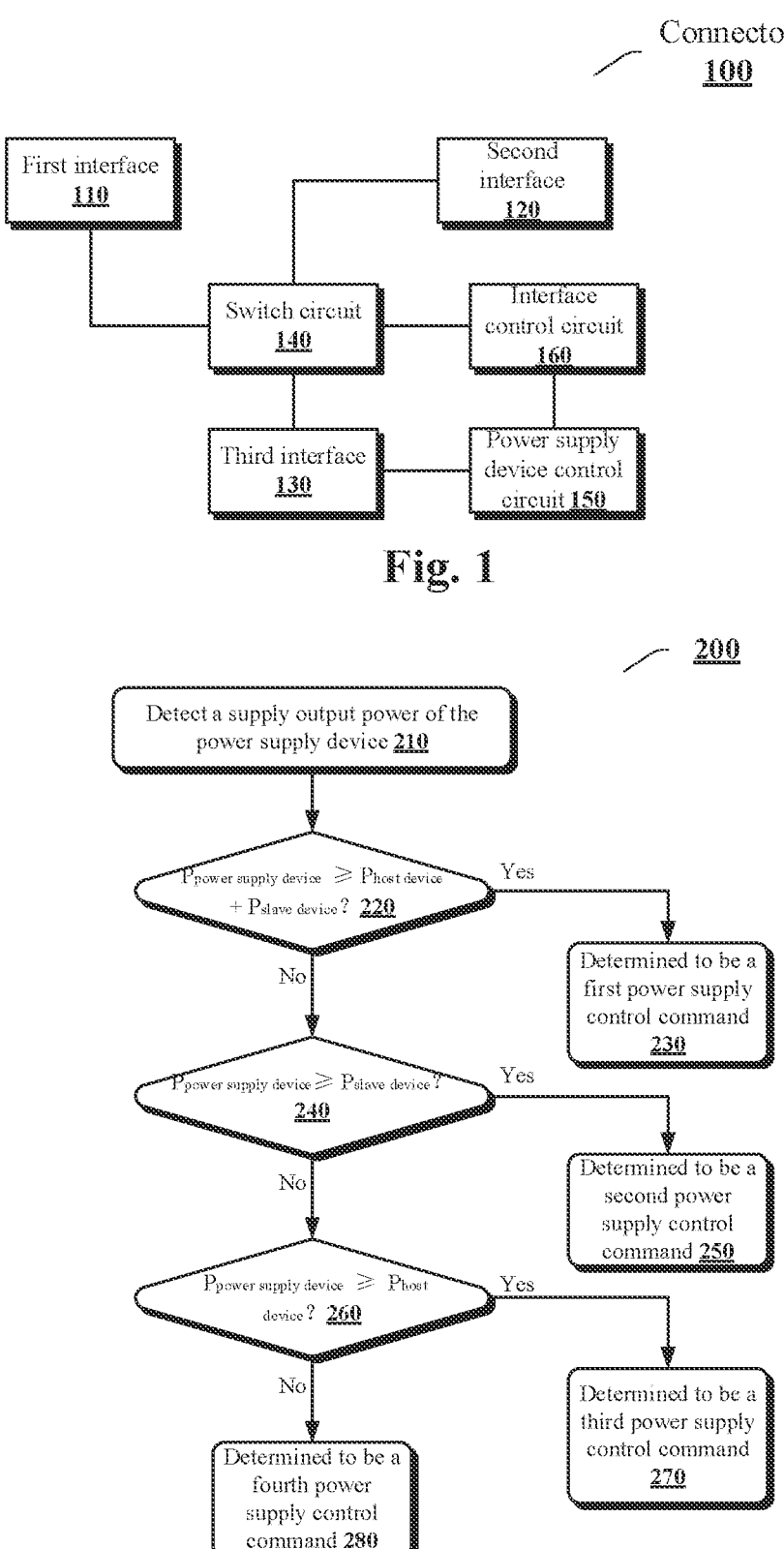
FIG. 1 shows an example schematic diagram of a connector according to a first embodiment of the present disclosure.
FIG. 2 shows a flow diagram of an example a power supply control command determination process according to a first embodiment of the present disclosure.

The subjects described herein will be discussed below with reference to exemplary implementations. It should be understood that these implementations are discussed just to enable those skilled in the art to better understand and thereby implement the subjects described herein, and are not intended to limit the scope of protection, applicability or examples of the present disclosure. Functions and arrangements of elements discussed can be changed without departing from the scope of protection of embodiments of the present disclosure. In examples, various processes or components may be omitted, substituted or added, as needed. Furthermore, features described with respect to some examples may also be combined in other examples.

As used herein, the term "includes" and its variants denote open-ended terms, meaning "including but not limited to". The term "based on" means "at least partially based on". The terms "one embodiment" and "an embodiment" denote "at least one embodiment". The term "another embodiment" denotes "at least one other embodiment". The terms "first", "second" and the like may refer to different or same objects. Other definitions can be included below; whether explicitly or implicitly: The definition of a term is consistent throughout the specification unless explicitly indicated in the context.

In the present disclosure, the term "connection", which may also be referred to as "coupling", means direct electrical connection between two components, or electrical connection via an intermediate component. In some situations, the term "connection" may also be understood as accommodation or a similar expression.

In a scenario where a host device and a slave device work collaboratively, the host device receives and processes data provided by the slave device, and then provides a data processing result to the slave device for subsequent processing. For example, in an application scenario of a virtual reality device or an augmented reality device, the virtual reality device or the augmented reality device may collect data by sensors, such as collecting image data and IMU data, etc., and send the collected data to a host device (e.g., a cell phone or other intelligent terminal device) having computing or processing capabilities for data processing. For example, the host device performs SLAM (Simultaneous Localization and Mapping) operations using the data collected by the slave device. Subsequently, the host device provides the data processing result, which may be an image processing result (e.g., a SLAM result), to the virtual reality device or the augmented display device for virtual reality display or augmented reality display.

When the host device and the slave device work collaboratively, the host device needs to use its own power module (e.g., lithium battery, etc.) to provide power to maintain its operation, so as to perform the corresponding data processing to provide a content output to the slave device. The host device also needs to supply power to the slave device to maintain the device operation of the slave device, which results in large power consumption of the host device, thus greatly limiting the endurance of the host device.

In view of the foregoing, embodiments of the present disclosure provide a connector for powering a host device and a slave device. The connector includes first to third interfaces, a switch circuit, a power supply device control circuit, and an interface control circuit. The first to third interfaces are configured to connect the host device, the slave device, and a power supply device, respectively. The switch circuit is connected to the first interface, the second interface, the third interface, and the interface control circuit. The power supply device control circuit is connected to the third interface and the interface control circuit. When the power supply device is plugged into the third interface, the power supply device control circuit detects a supply output power of the power supply device. The power supply device control circuit determines a power supply control command based on the supply output power, a required charging power for the host device, and an operating power of the slave device. The interface control circuit performs on-off control on the switch circuit according to the power supply control command, to control power supply from the power supply device to the host device and the slave device. Using the connector, a power supply strategy for the host device and the slave device may be determined based on the actual supply output power of the external power supply device, and efficient power supply from the external power supply device to the host device and the slave device is implemented according to the power supply strategy, and the endurance of the host device is improved.

FIG. 1 shows an example schematic diagram of a connector 100 according to a first embodiment of the present disclosure.

As shown in FIG. 1, the connector 100 includes a first interface 110, a second interface 120, a third interface 130, a switch circuit 140, a power supply device control circuit 150, and an interface control circuit 160. The first interface 110 is configured to connect a host device. The second interface 120 is configured to connect a slave device (UFP device). The third interface 130 is configured to connect a power supply device. In embodiments of the present disclosure, any of the first interface 110, the second interface 120, and the third interface 130 may be one of the following interfaces: a Type A interface, a Type B interface, a Type C interface, a Micro USB interface, a Mini USB interface, and a Lightning interface. Here, a device connected to an interface may, for example, have an interface component matched with the interface so that the device can be coupled with the interface. For example, assuming that the first interface is a Type C plug, the host device has a Type C socket (Type C slot) so that the first interface can be plugged into the Type C socket of the host device.

In the present disclosure, examples of the host devices may, for example, include, but are not limited to, cell phones, computers, intelligent terminal devices, and the like. Examples of the slave device may, for example, include, but are not limited to, virtual reality devices, augmented reality devices, and the like, e.g., AR glasses, and the like. The power supply device is a device or apparatus with power supply capability, e.g., a charging device (which may also be referred to as a power bank), a power source device, a power adaptation device, or the like. Examples of the charging device may include PD-type charging devices, QC-type charging devices, and the like. The power supply device control circuit 150 is electrically connected to a signal terminal of the third interface. The power supply device control circuit 150 may have output power detection capability for power supply from the power supply device.

When the power supply device is plugged into the third interface 130, the power supply device control circuit 150 may detect a supply output power of the power supply device at that time. For example, in the case where the third interface 130 is a Type C interface, the power supply device needs to support the PD protocol, so that when the power supply device is plugged into the third interface 130, the power supply device control circuit 150 may utilize the PD protocol to detect an output power signal for indicating a supply output power of the power supply device. For example, in the case where the power supply device is a PD type charging device, the power supply device control circuit 150 may be connected to a CC terminal of the third interface 130. When the power supply device is plugged into the third interface 130, the power supply device control circuit 150 may receive a CC signal from the CC terminal of the third interface 130 and obtain a supply output power, a power supply output voltage, and a power supply output current of the power supply device based on the CC signal. In the case where the power supply device is a QC type charging device, the power supply device control circuit 150 may be connected to a D+ terminal and a D-terminal of the third interface 130. When the power supply device is plugged into the third interface 130, the power supply device control circuit 150 may receive a D+ signal and a D-signal from the D+ terminal and the D-terminal of the third interface 130, and obtain a supply output power of the power supply device based on the D+ signal and the D-signal. Here, the detected supply output power is a real-time supply output power of the power supply device, and reflects real-time power supply capability of the power supply device.

After obtaining the supply output power of the power supply device, the power supply device control circuit 150 determines a power supply control command based on the supply output power of the power supply device, a required charging power for the host device, and an operating power of the slave device.

In the present disclosure, the required charging power for the host device is used to indicate a required supply power that can trigger a charging operation for the host device. When the supply power of the power supply device is less than the required charging power, the power supply device cannot charge the host device. The required charging power for the host device may be a factory-configured parameter of the host device, e.g., it may be characterized by a current value at a specified output voltage, and varies with the type of device, the model of the device, or the manufacturer of the device. In addition, for one host device, there may be a plurality of required charging powers available. For example, for a cell phone, required charging powers available may be "5V, 3 A," "5V, 1.5 A," "5V, 900 mA," etc. In addition, the required charging powers available for the host device may also include a required charging power in a normal charging state, a required charging power in a fast charging state, and the like. Here, the required charging power in the fast charging state is greater than the required charging power in the normal charging state. The operating power of the slave device is used to indicate an operating power required for normal operation of the slave device. The operating power of the slave device may, for example, be a nominal operating power or a rated operating power of the slave device.

In the present disclosure, the required charging power for the host device and the operating power of the slave device may be notified to the power supply device control circuit in advance, or notified to the power supply device control circuit by the host device or the slave device when the host device is connected to the first interface and the slave device is connected to the second interface. In some embodiments, the required charging power for the host device may also be determined by negotiation between the host device and the power supply device control circuit. For example, in the case where there are a plurality of required charging powers available for the host device, the power supply device control circuit may provide a power difference between the supply output power and the operating power of the slave device to the host device, and the host device selects, from the plurality of required charging powers available, a suitable required charging power available, based on the power difference, as a final required charging power to be provided to the power supply device control circuit.

FIG. 2 shows a flow diagram of an example a power supply control command determination process 200 according to a first embodiment of the present disclosure.

As shown in FIG. 2, at 210, in response to detecting that the power supply device is plugged into the third interface, the power supply device control circuit 150 detects a supply output power $P_{power\ supply\ device}$ of the power supply device.

At 220, it is determined whether the supply output power $P_{power\ supply\ device}$ is not less than the sum of the required charging power $P_{host\ device}$ for the host device and the operating power $P_{slave\ device}$ of the slave device. In the case where there are a plurality of required charging powers available for the host device, $P_{host\ device}$ may be a minimum required charging power available, or an required charging power available specified (by the host device or by a user), e.g. a required charging power available specified by negotiation between the power supply device control circuit and the host device.

If it is determined that $P_{power\ supply\ device} \geq P_{host\ device} + P_{slave\ device}$, then at 230, the power supply control command is determined to be a first power supply control command. The first power supply control command is configured to indicate that power to be supplied to both the host device and the slave device.

In an example, the first power supply control command is configured to indicate that the slave device be powered with the operating power of the slave device, and that the host device be charged with a remaining power (i.e., a power difference between the supply output power and the operating power of the slave device).

In another example, the first power supply control command is configured to indicate that the slave device be powered with operating power of the slave device and that the host device be charged with the required charging power for the host device. In the case where there are a plurality of required charging powers available for the host device, the power supply device control circuit may notify the host device of a power difference between the supply output power and the operating power of the slave device, and the host device selects, from the plurality of required charging powers available, a suitable required charging power available, based on the power difference, and then notifies the power supply device control circuit of the selected required charging power, or information equivalent thereto (e.g., a number, a code, unique identification information, etc. for the required charging power). Then, the power supply device control circuit charges the host device according to required charging power.

If it is determined that $P_{power\ supply\ device} < P_{host\ device} + P_{slave\ device}$, then at 240, it is determined whether the supply output power $P_{power\ supply\ device}$ of the power supply device is not less than the operating power $P_{slave\ device}$ of the slave device. If it is determined that $P_{power\ supply\ device} \geq P_{slave\ device}$, then at 250, the power supply control command is determined to be a second power supply control command. The second power supply control command is configured to indicate that power to be supplied to the slave device but not to the host device. In an example, the second power supply control command is configured to indicate that the slave device be powered with operating power $P_{slave\ device}$ of the slave device.

If it is determined that $P_{power\ supply\ device} < P_{slave\ device}$, then at 260, it is determined whether the supply output power $P_{power\ supply\ device}$ of the power supply device is not less than the required charging power $P_{host\ device}$ for the host device. If it is determined that $P_{power\ supply\ device} \geq P_{host\ device}$, then at 270, the power supply control command is determined to be a third power supply control command. The third power supply control command is configured to indicate that power to be supplied to the host device but not to the slave device. In an example, the charging of the host device may be performed according to the supply output power of the power supply device. In another example, the charging of the host device may be performed according to the required charging power for the host device. In the case where there are a plurality of required charging powers available for the host device, the power supply device control circuit may notify the host device of a power difference between the supply output power and the operating power of the slave device, and the host device selects a suitable required charging power from the plurality of required charging powers available, based on the power difference, and then notifies the power supply device control circuit of the selected required charging power, or information equivalent thereto (e.g., a number, a code, unique identification information, etc. for the required charging power). Then, the power supply device control circuit charges the host device according to required charging power.

If it is determined that $P_{power\ supply\ device} < P_{host\ device}$, then at 280, the power supply control command is determined to be a fourth power supply control command. The fourth power supply control command is configured to indicate that no power to be supplied to the host device and the slave device.

Figure 3:
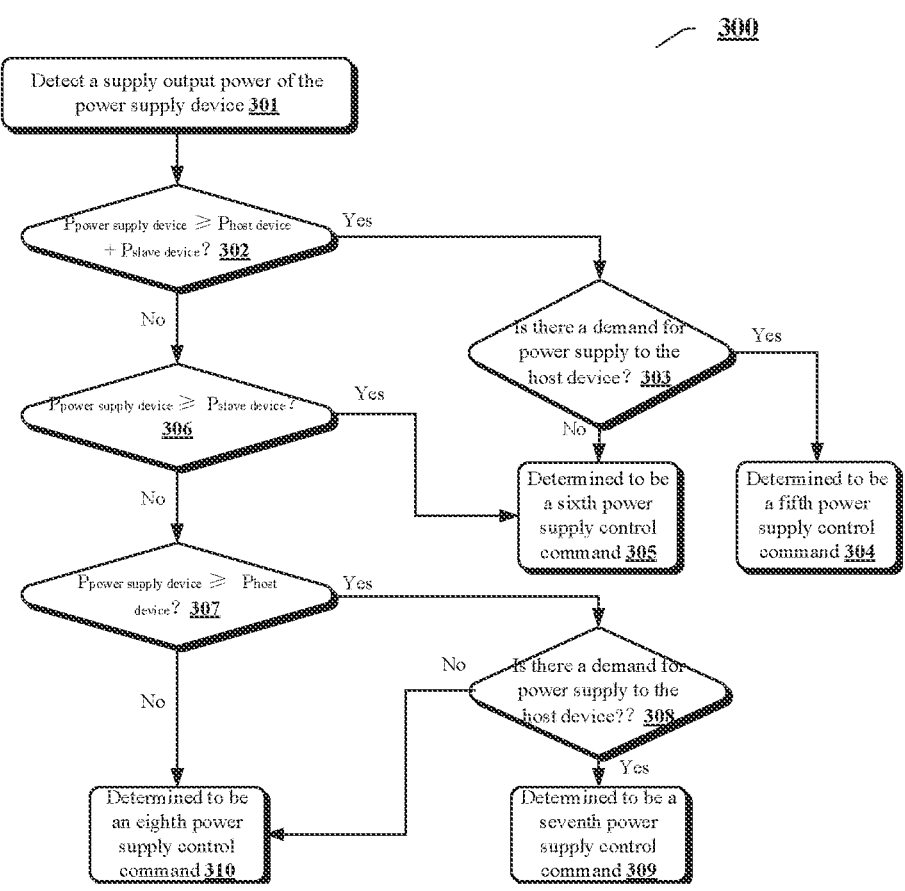
FIG. 3 shows a flow diagram of another example of a power supply control command determination process according to a first embodiment of the present disclosure.

FIG. 3 shows a flow diagram of another example a power supply control command determination process 300 according to a first embodiment of the present disclosure.

As shown in FIG. 3, at 301, in response to detecting that the power supply device is plugged into the third interface, the power supply device control circuit 150 detects a supply output power $P_{power\ supply\ device}$ of the power supply device.

At 302, it is determined whether the supply output power $P_{power\ supply\ device}$ is not less than the sum of the required charging power $P_{host\ device}$ for the host device and the operating power $P_{slave\ device}$ of the slave device. In the case where there are a plurality of required charging powers available for the host device. $P_{host\ device}$ may be a minimum required charging power available, or an required charging power available specified (by the host device or by a user), e.g. a required charging power available specified by negotiation between the power supply device control circuit and the host device.

If it is determined that $P_{power\ supply\ device} \geq P_{host\ device} + P_{slave\ device}$, then at 303, it is determined whether there is a demand for power supply to the host device. The demand for power supply is configured to indicate that an external power supply device is required to charge the host device.

In an example, the power supply device control circuit may determine, by negotiation with the host device, whether there is a demand for power supply to the host device, based on a power difference between the supply output power of the power supply device and the operating power of the slave device. For example, the power supply device control circuit sends the power difference between the supply output power of the power supply device and the operating power of the slave device to the host device, and the host device determines whether charging is required, based on the power difference. For example, if the power difference is greater than the required charging power, it is determined that a charging demand exists, and the charging demand is sent to the power supply device control circuit. In addition, optionally, a required charging power to be used during charging may be further determined based on the power difference. In another example, the power supply device control circuit may negotiate with the host device in advance to specify that charging is performed as long as a predetermined condition is met. For example, the predetermined condition may be that the supply output power $P_{power\ supply\ device}$ is not less than the sum of the required charging power $P_{host\ device}$ for the host device and the operating power $P_{slave\ device}$ of the slave device. In another example, the power supply device control circuit may determine that there is a demand for power supply to the host device in response to receiving a power supply request from the host device.

In response to determining that there is a demand for power supply to the host device, at 304, the power supply control command is determined to be a fifth power supply control command. The fifth power supply control command is configured to indicate that power to be supplied to both the host device and the slave device. Similarly, in an example, the fifth power supply control command is used to indicate that the slave device be powered with the operating power of the slave device, and that the host device be charged with a remaining power (i.e., a power difference between the supply output power and the operating power of the slave device). In another example, the fifth power supply control command is configured to indicate that the slave device be powered with the operating power of the slave device and the host device be charged with the required charging power for the host device. In the case where there are a plurality of required charging powers available for the host device, the power supply device control circuit may notify the host device of a power difference between the supply output power and the operating power of the slave device, and the host device selects a suitable required charging power from the plurality of required charging powers available, based on the power difference, and then notifies the power supply device control circuit of the selected required charging power, or information equivalent thereto (e.g., a number, a code, unique identification information, etc. for the required charging power). The power supply device control circuit subsequently charges the host device according to required charging power.

If it is determined that there is no demand for power supply to the host device, at 305, the power supply control command is determined to be a sixth power supply control command. The sixth power supply control command is configured to indicate that power to be supplied to the slave device but not to the host device. In an example, the sixth power supply control command is configured to indicate that the slave device be powered with the operating power $P_{slave\ device}$ of the slave device.

If it is determined that $P_{power\ supply\ device} < P_{host\ device} + P_{slave\ device}$, then at 306, it is determined whether the supply output power P power supply device of the power supply device is not less than the operating power $P_{slave\ device}$ of the slave device. If it is determined that $P_{power\ supply\ device} \geq P_{slave\ device}$, then at 305, the power supply control command is determined to be a sixth power supply control command.

If it is determined that $P_{power\ supply\ device} < P_{slave\ device}$, then at 307, it is determined whether the supply output power $P_{power\ supply\ device}$ of the power supply device is not less than the required charging power $P_{host\ device}$ for the host device. If it is determined that $P_{power\ supply\ device} \geq P_{host\ device}$, then at 308, it is determined whether there is a demand for power supply to the host device. If there is a demand for power supply to the host device, then at 309, the power supply control command is determined to be a seventh power supply control command. The seventh power supply control command is configured to indicate that power to be supplied to the host device but not to the slave device. In an example, the charging of the host device may be performed according to the supply output power of the power supply device. In another example, the charging of the host device may be performed according to the required charging power for the host device. In the case where there are a plurality of required charging powers available for the host device, the power supply device control circuit may notify the host device of a power difference between the supply output power and the operating power of the slave device, and the host device selects a suitable required charging power from the plurality of required charging powers available, based on the power difference, and then notifies the power supply device control circuit of the selected required charging power, or information equivalent thereto (e.g., a number, a code, unique identification information, etc. for the required charging power). The power supply device control circuit subsequently charges the host device according to required charging power.

If it is determined that there is no demand for power supply to the host device, then at 310, the power supply control command is determined to be an eighth power supply control command. The eighth power supply control command is configured to indicate that no power to be supplied to the host device and the slave device.

If it is determined that $P_{power\ supply\ device} < P_{host\ device}$, the process proceeds to 310. At 310, the power supply control command is determined to be an eighth power supply control command.

Returning to FIG. 1, the power supply device control circuit 150 is electrically connected to the interface control circuit 160. After the power supply device control circuit 150 determines the power supply control command, it sends the determined power supply control command to the interface control circuit 160.

The interface control circuit 160 is further configured to be electrically connected to the switch circuit 140, and the switch circuit 140 is configured to be electrically connected to the first interface 110, the second interface 120, and the third interface 130. The interface control circuit 160 may perform on-off control on the switch circuit 140 according to the power supply control command to achieve on and off of corresponding power supply lines between the power supply device, and the host device and the slave device, thereby allowing the power supply device to supply power to the host device and the slave device according to the power supply control command.

Figure 4:
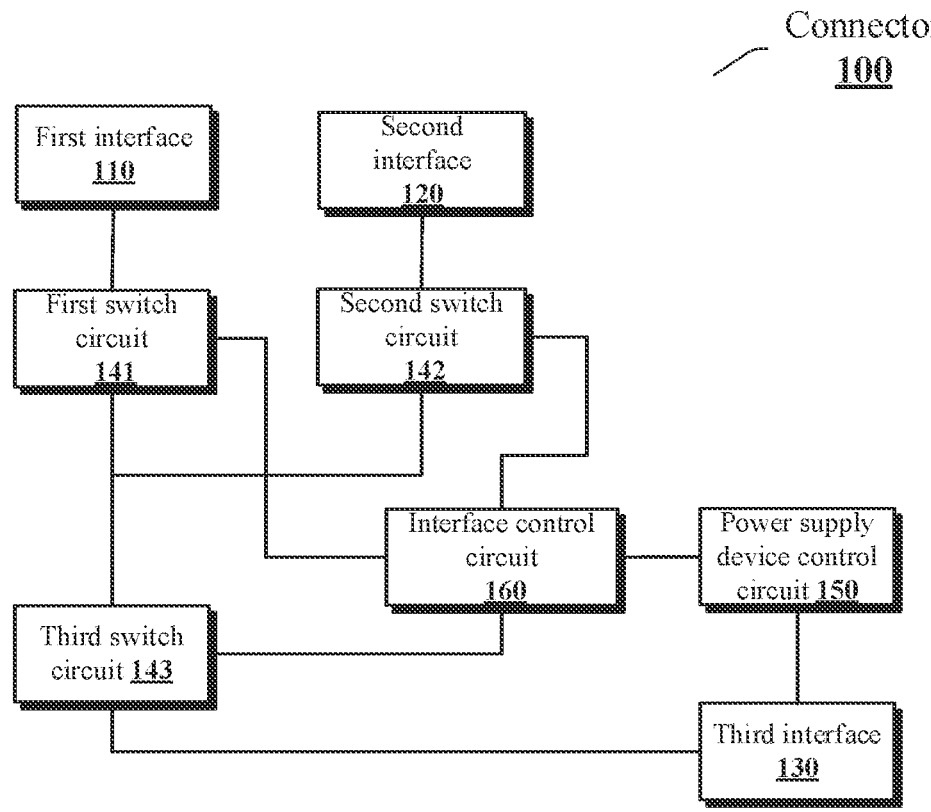
FIG. 4 shows a schematic diagram of an implementation example of a switch circuit according to a first embodiment of the present disclosure.

FIG. 4 shows a schematic diagram of an implementation example of a switch circuit 140 according to a first embodiment of the present disclosure.

As shown in FIG. 4, the switch circuit 140 includes a first switch circuit 141, a second switch circuit 142, and a third switch circuit 143. The first switch circuit 141 and the third switch circuit 143 are connected in series successively (e.g., via a power line) between power supply ports of the first interface 110 and the third interface 130. The second switch circuit 142 is connected (e.g., via a power line) between a power supply port of the second interface 120 and an intermediate point of connection (intermediate junction point, which may also be referred to as a point of connection) between the first switch circuit 141 and the third switch circuit 143.

In the present disclosure, the first switch circuit 141, the second switch circuit 142, and the third switch circuit 143 may be implemented by using any suitable switching mechanism, e.g., a digital switch circuit or an analog switch circuit, such as a switch circuit implemented on the basis of a transistor or a group of transistors, a switch circuit implemented on the basis of a field effect tube or a group of field effect tubes, or the like. In an example, a N-MOSFET and P-MOSFET combination may be used to implement the switch circuits.

It should be noted that the switch circuit 140 shown in FIG. 4 is merely an illustrative example. In other embodiments, other suitable ways may be adopted to implement the switch circuit 140 that can implement on and off the power supply lines based on the power supply control command.

Figure 5:
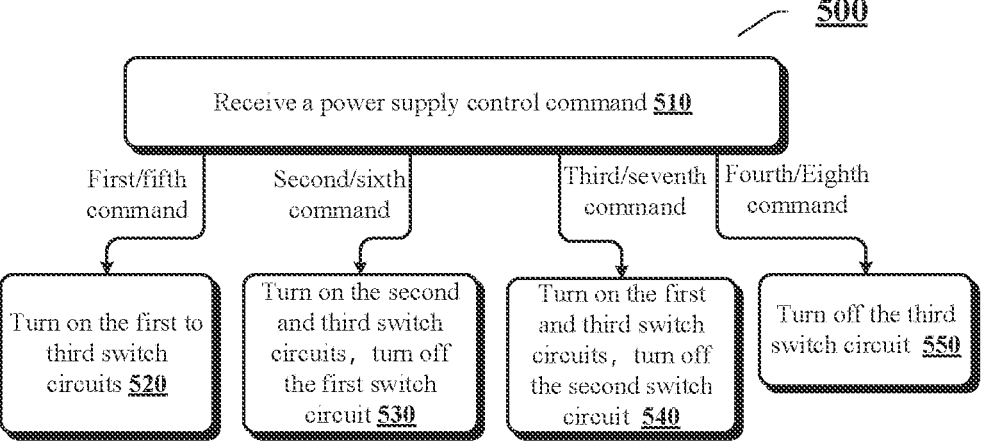
FIG. 5 shows a flow diagram of a control process of a switch circuit according to a first embodiment of the present disclosure.

FIG. 5 shows a flow diagram of a control process 500 of a switch circuit according to a first embodiment of the present disclosure. The control process is performed by the interface control circuit.

As shown in FIG. 5, at 510, a power supply control command is received from the power supply device control circuit 150.

In the case where the power supply control command is a first power supply control command or a fifth power supply control command, at 520, the switch circuit 140 is controlled such that the first switch circuit 141, the second switch circuit 142, and the third switch circuit 143 are all turned on. In this state, both the first interface and the second interface are in communication with the third interface.

In the case where the power supply control command is a second power supply control command or a sixth power supply control command, at 530, the switch circuit 140 is controlled such that the first switch circuit 141 is turned off and the second switch circuit 142 and the third switch circuit 143 are turned on. In this state, the second interface is in communication with the third interface.

In the case where the power supply control command is a third power supply control command or a seventh power supply control command, at 540, the switch circuit 140 is controlled such that the first switch circuit 141 and the third switch circuit 143 are turned on and the second switch circuit 142 is turned off. In this state, the first interface is in communication with the third interface.

In the case where the power supply control command is a fourth power supply control command or an eighth power supply control command, at 550, the switch circuit 140 is controlled such that the third switch circuit 143 is turned off. For example, in an example, the first switch circuit 141, the second switch circuit 142, and the third switch circuit 143 may be turned off. Alternatively, in another example, the first switch circuit 141 and the second switch circuit 142 are turned on and the third switch circuit 143 is turned off. In this state, neither the first interface nor the second interface is in communication with the third interface.

Optionally, in another example, the connector 100 may further include a signal transmission line (not shown) connected between the first interface 110 and the second interface 120. The signal transmission line is configured to perform data signal transmission and signaling signal transmission between the host device and the slave device, e.g., to transmit data signals and signaling signals required when data processing is performed by the host device and the slave device. Examples of the signal transmission line may include USB signal lines, DP (Display Port) signal lines, and so on.

Figure 6:
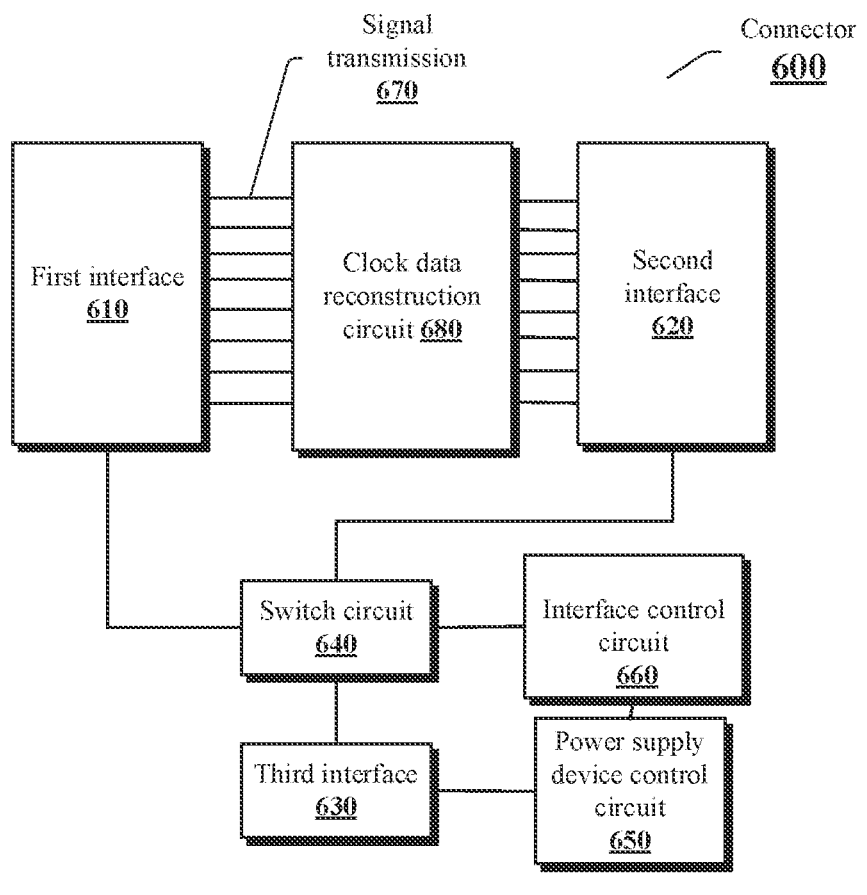
FIG. 6 shows an example schematic diagram of a connector according to a second embodiment of the present disclosure.

FIG. 6 shows an example schematic diagram of a connector 600 according to a second embodiment of the present disclosure. The connector 600 illustrated in the second embodiment is a modified example for the connector 100 illustrated in the first embodiment.

The connector 600 includes a first interface 610, a second interface 620, a third interface 630, a switch circuit 640, a power supply device control circuit 650, and an interface control circuit 660. The structures and operations of the first interface 610, the second interface 620, the third interface 630, the switch circuit 640, the power supply device control circuit 650, and the interface control circuit 660 are same as those of the first interface 110, the second interface 120, the third interface 130, the switch circuit 140, the power supply device control circuit 150, and the interface control circuit 160 of the connector 100 in the first embodiment, and will not be described here.

The connector 600 further includes a signal transmission line 670 connected between the first interface 610 and the second interface 620. The signal transmission line 670 is configured to perform data signal transmission and signaling signal transmission between the host device and the slave device. In addition, the signal transmission line 670 has a data transmission rate of not less than 5 Gbps, i.e., the signal transmission line is a high-speed signal transmission line for transmitting high-speed signals. The signal transmission line 670 may; for example, include a USB 3.1 signal line a DP signal line.

The connector 600 further includes a clock data reconstruction circuit 680 connected between the first interface 610 and the second interface 620 via the signal transmission line. The clock data reconstruction circuit 680 is configured to perform signal reconstruction and recovery of signals transmitted between the first interface 110 and the second interface 120).

In different application scenarios, cables connected to the host device side and the slave device side have different lengths and thickness, such that in the case where the signal transmission line has a signal transmission speed of up to 5-10 Gbps (for example, the signal transmission line is a USB 3.1 signal line or a DP signal line), DC attenuation and AC attenuation of the transmitted high-speed signals are very serious, and in most serious situations, a standard signal sent from a sending end cannot be received properly at a receiving end. Using the clock data reconstruction circuit described above, an adverse effect of a channel distribution parameter on the signal may be removed at the sending side, subsequently signal reconstruction is performed by the clock data recovery circuit, and then a reconstructed signal is sent out according to standard signal requirement again.

Figure 7:
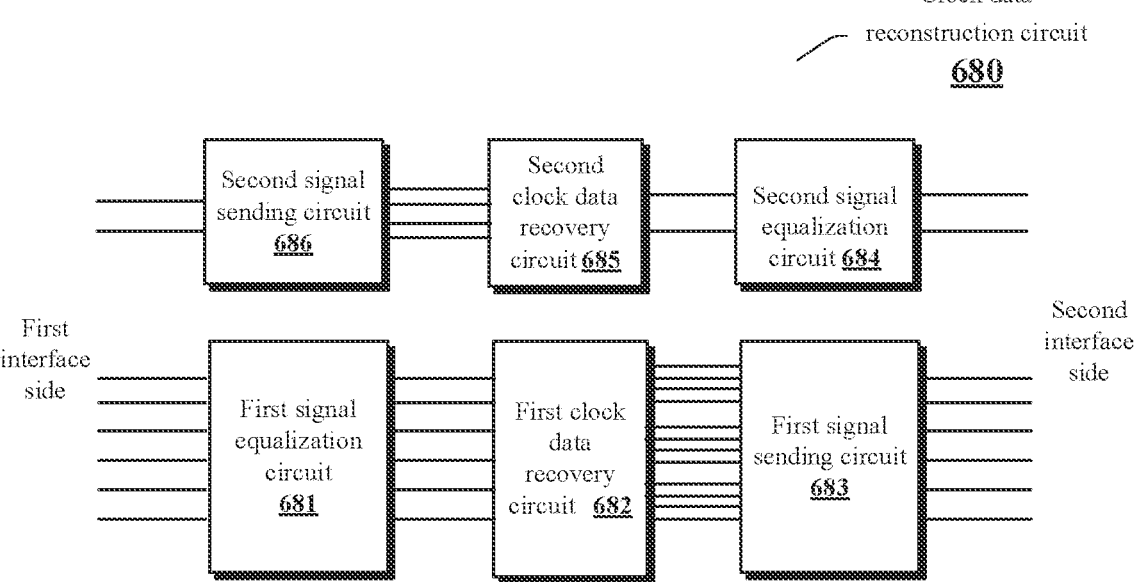
FIG. 7 shows an example schematic diagram of a clock data reconstruction circuit between a first interface and a second interface according to a second embodiment of the present disclosure.

FIG. 7 shows an example schematic diagram of a clock data reconstruction circuit 680) between a first interface and a second interface according to a second embodiment of the present disclosure.

As shown in FIG. 7, the clock data reconstruction circuit 680 may include a first signal equalization circuit 681, a first clock data recovery circuit 682, and a first signal sending circuit 683 connected in sequence between the first interface 110 and the second interface 120 via a signal transmission line. The first signal equalization circuit 681 performs signal equalization processing on a signal from a sending end at the side of the first interface 110, thereby removing an adverse effect of a channel distribution parameter on the signal. The first clock data recovery circuit 682 performs clock data recovery processing on the signal subjected to signal equalization processing, thereby accomplishing signal reconstruction. The first signal sending circuit 683 sends out again the signal reconstructed by the first clock data recovery circuit 682, according to standard signal requirement, thereby ensuring the transmission quality of the signal transmitted from the first interface side 110 to the second interface side 120.

The clock data reconstruction circuit 680 may further include a second signal equalization circuit 684, a second clock data recovery circuit 685, and a second signal sending circuit 686 connected in sequence between the second interface 120 and the first interface 110 via a signal transmission line. The functions and operations of the second signal equalizing circuit 684, the second clock data recovery circuit 685, and the second signal sending circuit 686 are same as those of the first signal equalizing circuit 681, the first clock data recovery circuit 682, and the first signal sending circuit 683, and will not be described here.

Figure 8:
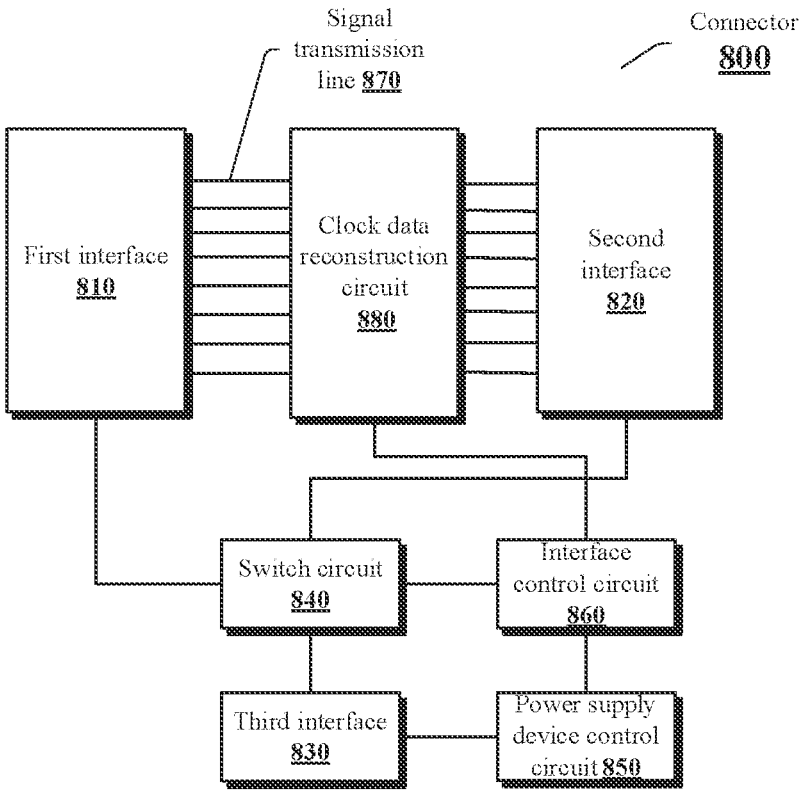
FIG. 8 shows an example schematic diagram of a connector according to a third embodiment of the present disclosure.

FIG. 8 shows an example schematic diagram of a connector 800 according to a third embodiment of the present disclosure. The connector 800 illustrated in the third embodiment is a modified example for the connector 600 illustrated in the second embodiment.

In the third embodiment, a first interface and a second interface are Type C interfaces, and a signal transmission line includes a first USB signal line and a DP signal line. The first USB signal line is configured to implement bidirectional communication between a host device and a slave device, and the DP signal line is configured to implement unidirectional communication from the host device to the slave device. The first USB signal line and the DP signal line have a data transmission rate of not less than 5 Gbps (i.e., a high-speed signal transmission line). The first USB signal line may, for example, include a USB 3.1 signal line. In addition, optionally, in another example, the signal transmission line may further include a second USB signal line. The second USB signal line has a data transmission rate of less than 5 Gbps (i.e., a low-speed signal transmission line), and the second USB signal line is directly connected between the first interface 110 and the second interface 120. Examples of the second USB signal line may include, for example, a USB 2.0 signal line, a USB 1.0 signal line, or the like.

The connector 800 includes a first interface 810, a second interface 820, a third interface 830, a switch circuit 840, a power supply device control circuit 850, an interface control circuit 860, and a signal transmission line 870. The structures and operations of the first interface 810, the second interface 820, the third interface 830, the switch circuit 840, the power supply device control circuit 850, the interface control circuit 860, and the signal transmission line 870 are same as those of the first interface 610, the second interface 620, the third interface 630, the switch circuit 640, the power supply device control circuit 650, the interface control circuit 660, and the signal transmission line 670, and will not be described here.

Figure 9:
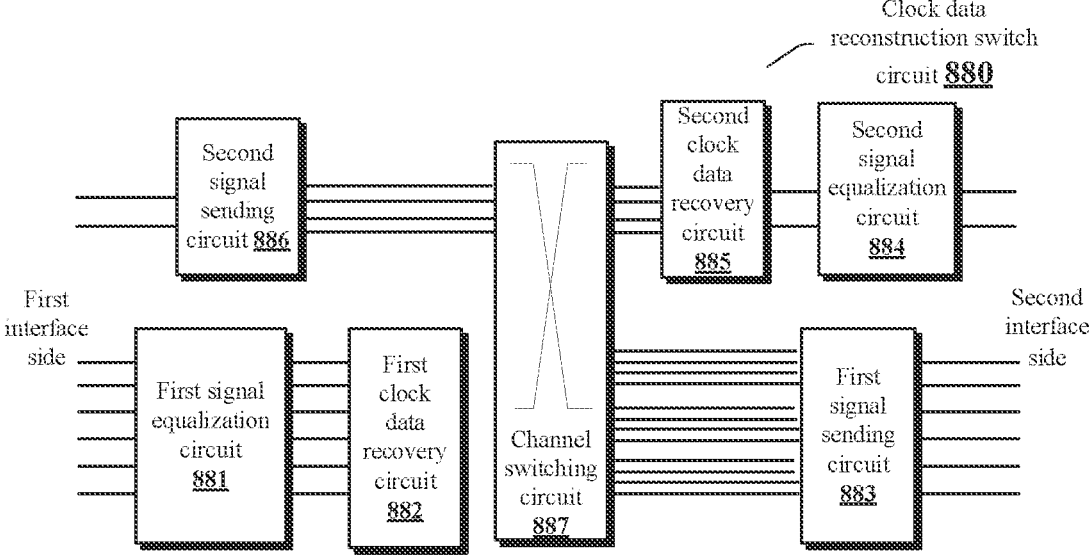
FIG. 9 shows an example schematic diagram of a clock data reconstruction switch circuit between a first interface and a second interface according to a third embodiment of the present disclosure.

The connector 800 differs from connector 600 in a clock data reconstruction switch circuit 880 in the connector 800. FIG. 9 shows an example schematic diagram of a clock data reconstruction switch circuit 880 between a first interface and a second interface according to a third embodiment of the present disclosure.

As shown in FIG. 9, unlike the clock data reconstruction circuit 680 in FIG. 6, in addition to including all of the components included in the clock data reconstruction circuit 680, the clock data reconstruction switch circuit 880 includes a channel switching circuit 887 connected between a first clock data recovery circuit 882 and a first signal sending circuit 883, and between a second clock data recovery circuit 885 and a second signal sending circuit 886, via high-speed signal transmission lines. The channel switching circuit 887 is configured to perform channel switching processing on the signal transmission lines based on a forward/reverse insertion status of the host device and the slave device. The positive/reverse plug status of the host device and the slave device may be detected by the interface control circuit by using the PD protocol.

Optionally, in an example, the interface control circuit 860 may have two control ports that support the PD protocol, wherein one control port is connected to a CC signal terminal of the first interface 110 via a signal line, and the other control port is connected to two CC signal terminals of the second interface 120 via two signal lines.

When the host device and the slave device are plugged into the first interface and the second interface, respectively, the interface control circuit 860 may determine a forward/reverse insertion status between the host device and the slave device on the basis of CC signals received from the CC signal terminals of the first interface 110 and the second interface 120, and send the determined forward/reverse insertion status (a channel switching control signal) to the channel switching circuit 887. For example, it may be sent to the channel switching circuit 887 through a GPIO (General Purpose Input Output) control line or an I2C control line. Accordingly, the channel switching control signal may be a GPIO signal or an I2C signal.

Figure 10:
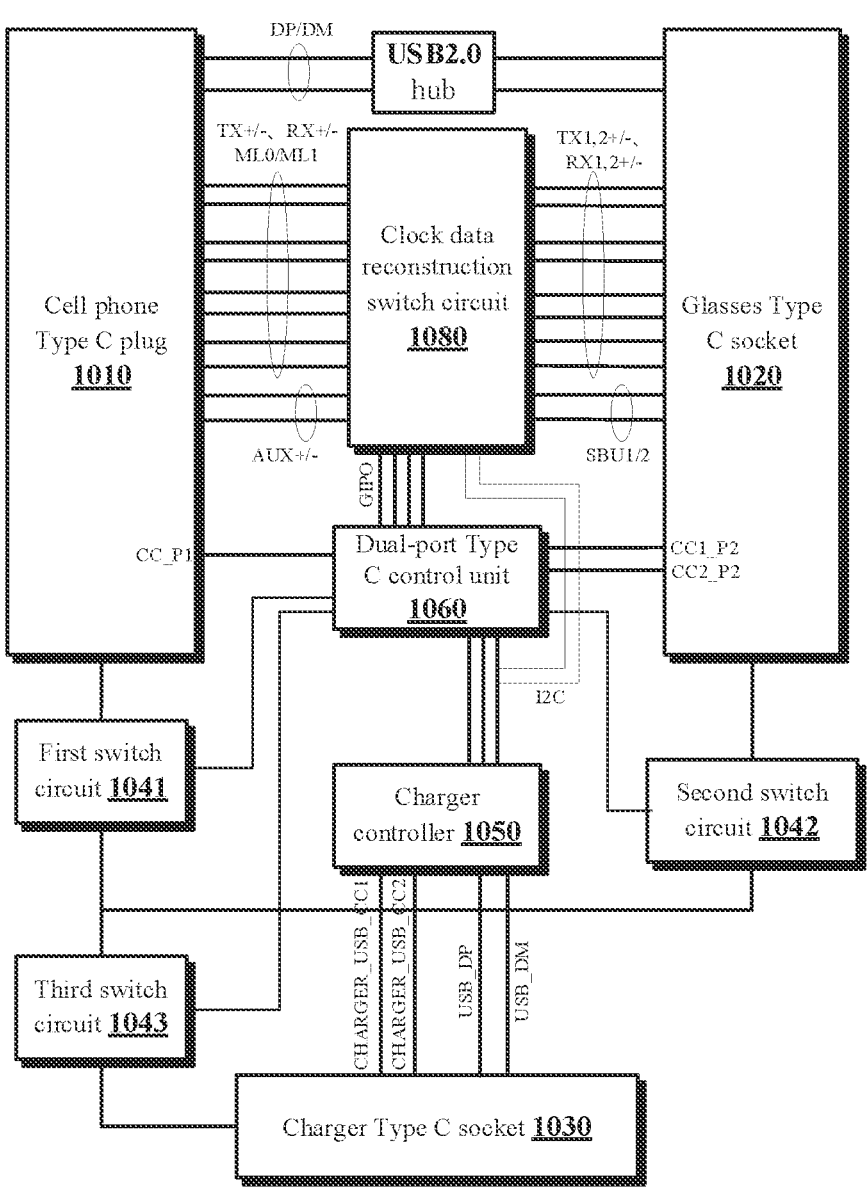
FIG. 10 shows a schematic diagram of a connector implemented on the basis of a type C interface according to a fourth embodiment of the present disclosure.

FIG. 10 shows a schematic diagram of a connector 1000 implemented on the basis of a type C interface according to a fourth embodiment of the present disclosure. The connector 1000 illustrated in FIG. 10 is applied to an application scenario where a cell phone and AR glasses work coordinately:

In this embodiment, a cell phone acts as a host device, and a first interface is a cell phone Type C plug 1010. AR glasses act as a slave device, and a second interface is a glasses Type C socket 1020. A charger acts as a power supply device, and a third interface is a charger Type C socket 1030.

Signal transmission signaling between the cell phone Type C plug 1010 and the glasses Type C socket 1020 includes a USB 2.0 signal line (second USB signal line), a USB 3.1 signal line (first USB signal line), and a DP signal line. The USB 2.0 signal line is directly connected between corresponding terminals of the cell phone Type C plug 1010 and the glasses Type C socket 1020, thereby allowing USB 2.0 signals to be transmitted between the cell phone Type C plug 1010 and the glasses Type C socket 1020 through the USB 2.0 signal line. Signals transmitted by the USB 3.1 signal line and the DP signal line are processed by a clock data reconstruction switch circuit 1080, and then the processed signals are transmitted from a transmitting end to a receiving end.

A power supply device control circuit is implemented by a charger controller 1050. Four signal lines, namely, Charger_USB_CC1, Charger_USB_CC2, USB_DP, and USB_DM, are connected between the charger controller 1050 and the charger Type C socket 1030. When the power supply device is plugged into the charger Type C socket 1030, a supply output power of the charger may be detected, and transmitted to the charger controller 1050 through the signal lines described above. Then, the charger controller 1050 determines a power supply control command based on the detected supply output power, a required charging power for the cell phone, and an operating power of the glasses, and sends the power supply control command to an interface control circuit. In an example, the charger controller 1050 may, for example, be implemented by a Cypress CCG3PA chip.

The interface control circuit can be implemented by a dual-port Type C control unit 1060, e.g., implemented by a Cypress CCG4 chip. The dual-port Type C control unit 1060 is connected to the first to third switch circuits 1041-1043, respectively, for controlling the on and off status of the first to third switch circuits 1041-1043 according to the power supply control command, thereby implementing power supply control of the power supply device to the cell phone and the glasses. In addition, the dual-port Type C control unit 1060 is also connected to a CC_P1 terminal of the cell phone Type C plug 1010 and two CC terminals (CC1_P2 and CC2_P2) of the glasses Type C socket 1020, respectively. When the cell phone is plugged into the cell phone Type C plug 1010 and the glasses are plugged into the glasses Type C socket 1020, the dual-port Type C control unit 1060 determines a forward/reverse insertion status of the cell phone and the glasses based on a CC_P1 signal from the CC_P1 terminal of the cell phone Type C plug 1010, and a CC1_P2 signal and a CC2_P2 signal from the CC1_P2 terminal and the CC2_P2 terminal of the glasses Type C socket 1020. Then, the dual-port Type C control unit 1060 transmits the determined forward/reverse insertion status to the clock data reconstruction switch circuit 1080 via a GPIO line or an I2C line. The clock data reconstruction switch circuit 1080 performs signal transmission channel switching processing based on the determined forward/reverse insertion status.

The dual-port Type C control unit 1060, the cell phone Type C plug 1010, and the glasses Type C socket 1020 support the PD protocol, such that after the cell phone is plugged into the cell phone Type C plug 1010 and the glasses are plugged into the glasses Type C socket 1020, the dual-port Type C control unit 1060 may communicate and negotiate with a PD control module at the cell phone side to determine an operating mode of the glasses and whether power supply is required, and so on. In addition, the dual-port Type C control unit 1060 may also communicate and negotiate with a PD control module at the glasses side to ensure that video streaming and data streaming communication between the cell phone and the glasses is properly implemented.

Figure 11:
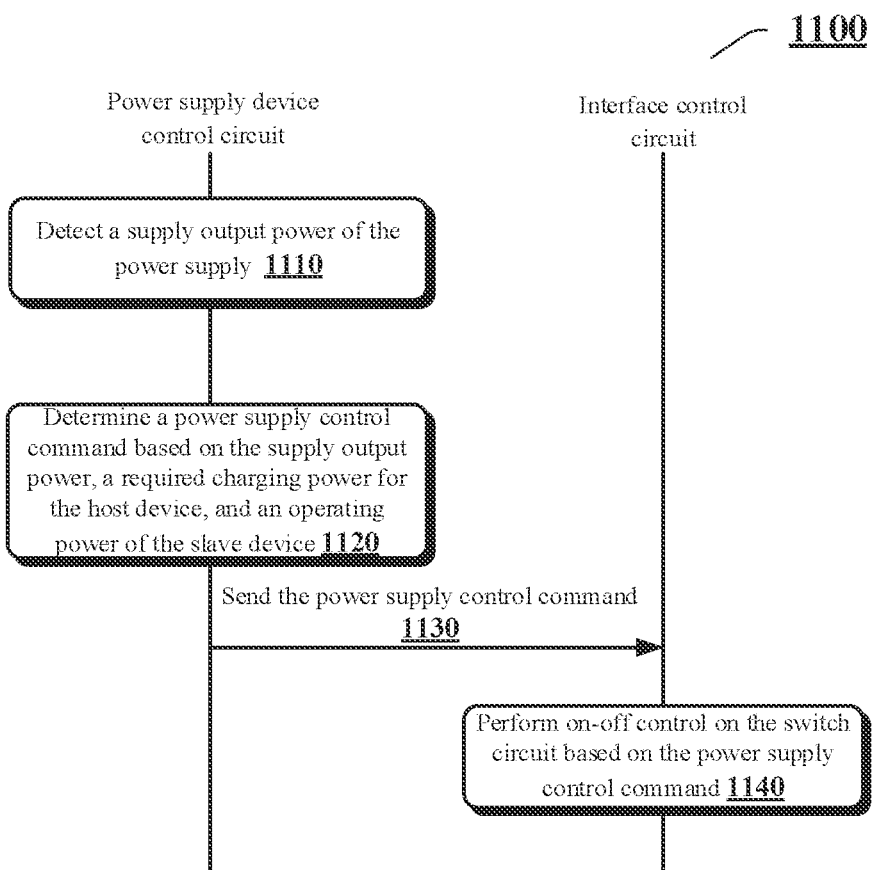
FIG. 11 shows a flow diagram of a power supply control method applied to a connector according to a fifth embodiment of the present disclosure.

FIG. 11 shows a flow diagram of a power supply control method 1100 applied to a connector according to a fifth embodiment of the present disclosure.

As shown in FIG. 11, at 1100, at a power supply device control circuit, in response to detecting that a power supply device is plugged into a third interface, detecting a supply output power of the power supply device.

At 1120, at the power supply device control circuit, a power supply control command of the power supply device for a host device and a slave device is determined based on the supply output power, a required charging power for the host device, and an operating power of the slave device. For the process of determining the power supply control command, reference is made specifically to the above description.

At 1130, the power supply device control circuit sends the power supply control command to an interface control circuit.

At 1140, at the interface control circuit, in response to receiving the power supply control command, on-off control is performed on the switch circuit according to the power supply control command, to control power supply from the power supply device to the host device and the slave device. For the control process of the switch circuit, reference is made specifically to the above description.

Figure 12:
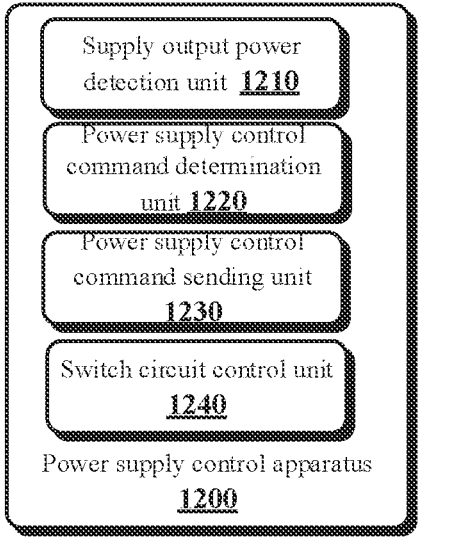
FIG. 12 shows a block diagram of a power supply control apparatus applied to a connector according to a sixth embodiment of the present disclosure.

FIG. 12 shows a block diagram of a power supply control apparatus 1200 applied to a connector according to a sixth embodiment of the present disclosure.

As shown in FIG. 12, the power supply control apparatus 1200 includes a supply output power detection unit 1210, a power supply control command determination unit 1220, a power supply control command sending unit 1230, and a switch circuit control unit 1240. The supply output power detection unit 1210, the power supply control command determination unit 1220, and the power supply control command sending unit 1230 constitute a power supply device control circuit, or serve as components of a power supply device control circuit. The switch circuit control unit 1240 acts as an interface control circuit, or serves as a component of an interface control circuit.

The supply output power detection unit 1210 is configured to detect a supply output power of a power supply device in response to detecting that the power supply device is plugged into a third interface.

The power supply control command determination unit 1220 is configured to determine a power supply control command of the power supply device for a host device and a slave device based on the supply output power, a required charging power for the host device, and an operating power of the slave device.

The power supply control command sending unit 1230 is configured to send the power supply control command to the interface control circuit.

The switch circuit control unit 1240 is configured to, in response to receiving the power supply control command, perform on-off control on a switch circuit according to the power supply control command, to control power supply from the power supply device to the host device and the slave device.

Embodiments of a connector, a power supply control method and a power supply control apparatus applied to a connector according to embodiments of the present disclosure are described above with reference to FIGS. 1 to 12. The details mentioned in the above description of method embodiments also apply to apparatus embodiments of the present disclosure. The above-mentioned power supply control apparatus may be implemented in hardware, and may also be implemented in software, or a combination of hardware and software.

Figure 13:
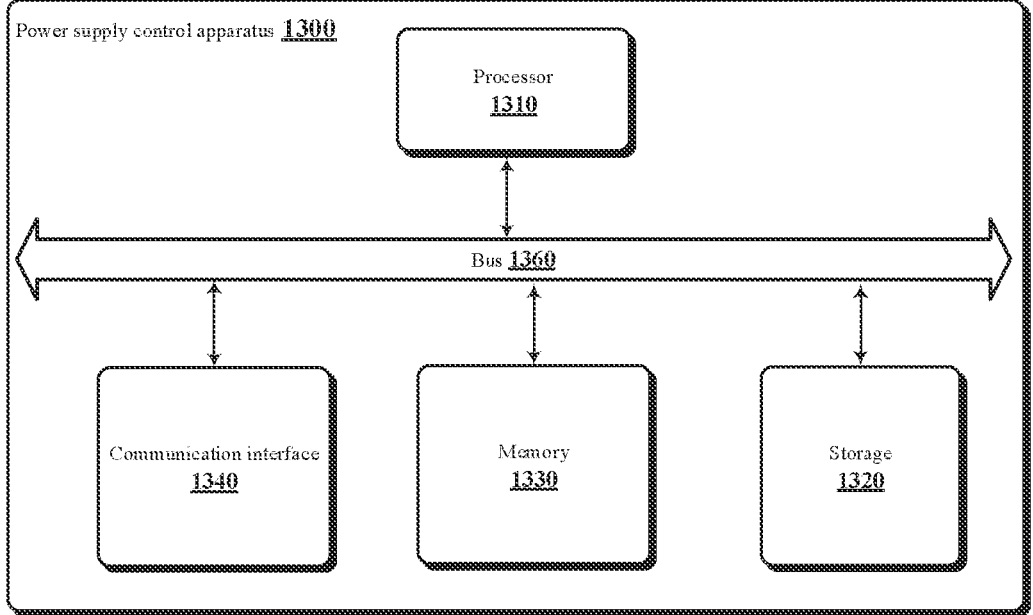
FIG. 13 shows an example hardware schematic diagram of a power supply control apparatus implemented on the basis of a computer system according to a seventh embodiment of the present disclosure.

FIG. 13 shows an example hardware schematic diagram of a power supply control apparatus 1300 implemented on the basis of a computer system according to embodiments of the present disclosure. As shown in FIG. 13, the power supply control apparatus 1300 may include at least one processor 1310, a memory (such as a nonvolatile memory) 1320, an internal storage 1330, and a communication interface 1340, and the at least one processor 1310, the memory 1320, the internal storage 1330 and the communication interface 1340 are connected together via a bus 1360. The at least one processor 1310 executes a computer program (i.e., an element implemented in software form as described above) stored or encoded in the memory.

In an embodiment, a computer program is stored in the memory, and the computer program, when executed, causes the at least one processor 1310 to: at the side of a power supply device control circuit, in response to detecting that a power supply device is plugged into a third interface, detect a supply output power of the power supply device: determine a power supply control command of the power supply device for a host device and a slave device based on the supply output power, a required charging power for the host device, and an operating power of the slave device; and send the power supply control command to an interface control circuit; and at the side of the interface control circuit, in response to receiving the power supply control command, perform on-off control on a switch circuit according to the power supply control command, to control power supply from the power supply device to the host device and the slave device.

It should be understood that the computer program stored in the memory, when executed, causes the at least one processor 1310 to perform the various operations and functions described above in conjunction with FIGS. 1 to 12 in embodiments of the present disclosure.

According to one embodiment, a program product such as a computer-readable medium is provided. The computer-readable medium may have a computer program (i.e., an element implemented in software form as described above) which, when executed by a processor, causes the processor to perform the various operations and functions described above in conjunction with FIGS. 1 to 12 in embodiments of the present disclosure. Specifically, a system or apparatus with a computer-readable storage medium may be provided, wherein software program codes implementing the functions of any of the above embodiments is stored in the computer-readable storage medium, and a computer or processor of the system or apparatus is caused to read and execute the computer program stored in the computer-readable storage medium.

In this case, the computer program codes read from the computer-readable medium can themselves can implement the functions of any of the above embodiments, so the computer-readable codes and the computer-readable storage medium storing the computer-readable codes form part of the present invention.

Embodiments of the computer-readable storage medium include a floppy disk, a hard disk, a magnetic optical disk, an optical disk (e.g., CD-ROM, CD-R, CD-RW, DVD-ROM, DVD-RAM, and DVD-RW), a magnetic tape, a non-volatile memory card, and an ROM. Optionally, the program codes may be downloaded from a server computer or from a cloud via a communication network.

According to one embodiment, there is provided a computer program product including a computer program which, when executed by a processor, causes the processor to perform the various operations and functions described above in conjunction with FIGS. 1 to 13 in embodiments of the present disclosure.

In an example, a host device may be referred to as a first device, and a slave device may be referred to as a second device. The first device and the second device are connected via a connector provided in embodiments of the present disclosure. The first device sends to-be-presented content data to the second device through the e.g., above-mentioned connector, and the second device receives the to-be-presented content data and performs displaying. e.g., virtual reality display or augmented reality display.

Optionally, the second device collects data by sensors and sends the data collected by the sensors to the first device through the above-mentioned connector. The first device processes the data collected by the above-mentioned sensors so that the second device displays the to-be-presented content data according to a result of the above-mentioned data processing. Optionally, the data collected by the above-mentioned sensors may be image data and IMU data, etc., and the above-mentioned data processing may be SLAM operations, etc.

The present disclosure also provides a connector including: a first interface configured to connect a first device: a second interface configured to connect a second device: a third interface configured to connect a power supply device; and a switch circuit connected to the first interface, the second interface, and the third interface. The connector is configured to detect a supply output power of the power supply device and determine a power supply control command of the power supply device for a first device and a second device based on the supply output power, a required charging power for the first device, and an operating power of the second device, to enable the switch circuit to switch among the following states, in response to detecting that the power supply device is plugged into the third interface; a first state in which both the first interface and the second interface are in communication with the third interface; a second state in which the first interface is in communication with the third interface; a third state in which the second interface is in communication with the third interface; and a fourth state in which neither the first interface nor the second interface is in communication with the third interface.

Optionally: the connector further includes a power supply device control circuit and an interface control circuit. The power supply device control circuit is connected to the third interface, and is configured to detect a supply output power of the power supply device and determine a power supply control command of the power supply device for the first device and the second device based on the supply output power, a required charging power for the first device, and an operating power of the second device, in response to detecting that the power supply device is plugged into the third interface. The interface control circuit is connected to the switch circuit and the power supply device control circuit, and is configured to, perform on-off control on the switch circuit (i.e., causing the switch circuit to switch among the states as described above) based on the power supply control command, to control power supply from the power supply device to the first device and the second device, in response to receiving the power supply control command from the power supply device control circuit.

It should be understood by those skilled in the art that various variations and modifications can be made to the embodiments of the above description without departing from the essence of the present invention.

It should be noted that not all of the steps and units in the above processes and system schematic diagrams are indispensable, and some steps or units may be omitted depending on actual needs. The order of execution of the steps is not fixed and may be determined as needed. The apparatus structures described in the above embodiments can be physical structures, and may also be logical structures, i.e., some units may be implemented by the same physical entity, or some units may be implemented respectively by a plurality of physical entities, or may be implemented jointly by some components of a plurality of independent devices.

In the above embodiments, hardware units or modules may be implemented in a mechanical way or electrical way. For example, a hardware unit, module or processor may include permanently dedicated circuitry or logic (such as a dedicated processor, FPGA or ASIC) to perform a corresponding operation. The hardware unit or processor may also include programmable logic or circuitry (such as a general-purpose processor or other programmable processor), which may be temporarily set by software to perform an appropriate operation. The specific way of implementation (mechanical way, or dedicated permanent circuitry, or temporarily set circuitry) may be determined based on cost and time considerations.

The specific implementations set forth above in conjunction with the accompanying drawings describe exemplary embodiments. The term "exemplary" used throughout the present disclosure means "used as an example, instance or illustration" and does not mean "preferred" or "advantageous" over other embodiments. For the purpose of providing understanding of the described technology, specific implementations include specific details. However, the technology can be implemented without the specific details. In some examples, to avoid making the concepts in the described embodiments difficult to understand, commonly known structures and apparatuses are shown in the form of block diagrams.

The foregoing description of the present disclosure is provided to enable any person of ordinary skill in the art to implement or use the present disclosure. Various modifications to the present disclosure are obvious to those of ordinary skill in the art, and the general principles defined herein can also be applied to other variations without departing from the scope of protection of the present disclosure. Thus, the present disclosure is not limited to the examples and designs described herein, but is consistent with the broadest scope conforming to the principles and novelty features of the present disclosure.

The invention claimed is:

1. A connector, comprising:

a first interface configured to connect a host device;

a second interface configured to connect a slave device;

a third interface configured to connect a power supply device;

a switch circuit connected to the first interface, the second interface and the third interface;

a power supply device control circuit connected to the third interface, and configured to detect a supply output power of the power supply device in response to detecting that the power supply device is plugged into the third interface, and determine a power supply control command of the power supply device for the host device and the slave device based on comparison between the supply output power and both of a pre-determined charging power for the host device and a pre-determined operating power of the slave device; and an interface control circuit connected to the switch circuit and the power supply device control circuit, and configured to perform on-off control on the switch circuit based on the power supply control command, to control power supply from the power supply device to the host device and the slave device, in response to receiving the power supply control command from the power supply device control circuit.

2. The connector according to claim 1, wherein the power supply device control circuit is configured to:

in response to the fact that the supply output power of the power supply device is not less than the sum of the pre-determined charging power for the host device and the pre-determined operating power of the slave device, determine the power supply control command to be a first power supply control command, the first power supply control command configured to indicate that power to be supplied to both the host device and the slave device;

in response to that the fact the supply output power of the power supply device is less than the sum of the pre-determined charging power for the host device and the pre-determined operating power of the slave device and not less than the pre-determined operating power of the slave device, determine the power supply control command to be a second power supply control command, the second power supply control command configured to indicate that power to be supplied to the slave device but not to the host device;

in response to the fact that the supply output power of the power supply device is less than the pre-determined operating power of the slave device and not less than the pre-determined charging power for the host device, determine the power supply control command to be a third power supply control command, the third power supply control command configured to indicate that power to be supplied to the host device but not to the slave device; and in response to the fact that the supply output power of the power supply device is less than the pre-determined charging power for the host device, determine the power supply control command to be a fourth power supply control command, the fourth power supply control command configured to indicate that no power to be supplied to the host device and the slave device.

3. The connector according to claim 1, wherein the power supply device control circuit is configured to:

in response to the fact that the supply output power of the power supply device is not less than the sum of the pre-determined charging power for the host device and the pre-determined operating power of the slave device and that there is a demand for power supply to the host device, determine the power supply control command to be a fifth power supply control command, the fifth power supply control command configured to indicate that power to be supplied to both the host device and the slave device;

in response to one of: the fact that the supply output power of the power supply device is not less than the sum of the pre-determined charging power for the host device and the pre-determined operating power of the slave device and that there is no demand for power supply to the host device, and the fact that the supply output power of the power supply device is not less than the pre-determined operating power of the slave device but less than the sum of the pre-determined charging power for the host device and the pre-determined operating power of the slave device, determine the power supply control command to be a sixth power supply control command, the sixth power supply control command configured to indicate that power to be supplied to the slave device but not to the host device;

in response to the fact that the supply output power of the power supply device is less than the pre-determined operating power of the slave device but not less than the pre-determined charging power for the host device and that there is a demand for power supply to the host device, determine the power supply control command to be a seventh power supply control command, the seventh power supply control command configured to indicate that power to be supplied to the host device but not to the slave device;

in response to one of: the fact that the supply output power of the power supply device is less than the pre-determined operating power of the slave device but not less than the pre-determined charging power for the host device and that there is no demand for power supply to the host device, and the fact that the supply output power of the power supply device is less than the pre-determined charging power for the host device, determine that the power supply control command is an eighth power supply control command, the eighth power supply control command configured to indicate that no power to be supplied to the host device and the slave device.

4. The connector according to claim 2, wherein the charging for the host device and the slave device is configured in one of the following manners:

powering the slave device with the pre-determined operating power of the slave device and charging the host device with a power difference between the supply output power and the pre-determined operating power of the slave device, and powering the slave device with the pre-determined operating power of the slave device and charging the host device with the pre-determined charging power for the host device.

5. The connector according to claim 2, wherein the power supply device control circuit is configured to, in response to the fact that the pre-determined charging power comprises a plurality of power options available for the host device, notify the host device of a power difference between the supply output power and the pre-determined operating power of the slave device, such that the host device selects a suitable power option from the plurality of power options available, based on the power difference.

6. The connector according to claim 3, wherein the power supply device control circuit is configured to determine that there is a demand for power supply to the host device, in one of the following manners:

determination by negotiation with the host device based on a power difference between the supply output power of the power supply device and the pre-determined operating power of the slave device;

specifying by negotiation in advance with the host device; and determination in response to receiving a power supply request from the host device.

7. The connector according to claim 1, wherein the switch circuit comprises:

a first switch circuit and a third switch circuit connected in series successively between power supply ports of the first interface and the third interface; and a second switch circuit connected between a power supply port of the second interface and a point of connection between the first switch circuit and the second switch circuit.

8. The connector according to claim 1, further comprising:

a signal transmission line connected between the first interface and the second interface, configured to perform data signal transmission and signaling signal transmission between the host device and the slave device.

9. The connector according to claim 8, wherein the signal transmission line has a data transmission rate of not less than 5 Gbps, and the connector further comprises one of the following configurations:

a first signal equalization circuit, a first clock data recovery circuit, and a first signal sending circuit connected in sequence between the first interface and the second interface via the signal transmission line; and a second signal equalization circuit, a second clock data recovery circuit, and a second signal sending circuit connected in sequence between the second interface and the first interface via the signal transmission line.

10. The connector according to claim 8, wherein the first interface and the second interface are USB Type C interfaces, and the signal transmission line comprises a first USB signal line, a second USB signal line, and a Display Port (DP) signal line, wherein the first USB signal line and the second USB signal line are configured to implement bidirectional communication between the host device and the slave device, and the DP signal line is configured to implement unidirectional communication from the host device to the slave device; the first USB signal line and the DP signal line have a data transmission rate of not less than 5 Gbps, and the second USB signal line has a data transmission rate of less than 5 Gbps; and the second USB signal line is connected between the first interface and the second interface.

11. The connector according to claim 10, further comprising at least one of:

a first signal equalization circuit, a first clock data recovery circuit, and a first signal sending circuit connected in sequence between the first interface and the second interface via the first USB signal line and the DP signal line; and a second signal equalization circuit, a second clock data recovery circuit, and a second signal sending circuit connected in sequence between the second interface and the first interface via the first USB signal line and the DP signal line.

12. The connector according to claim 11, further comprising:

a channel switching circuit, connected between the first clock data recovery circuit and the first signal sending circuit and connected between the second clock data recovery circuit and the second signal sending circuit via at least one of the first USB signal line and the DP signal line, and configured to perform channel switching processing on the first USB signal line and the DP signal line based on a forward/reverse insertion status of the host device and the slave device.

13. The connector according to claim 1, wherein the connector is configured to:

receive to-be-presented content data from the host device and send the to-be-presented content data to the slave device, and receive data collected by sensors of the slave device and send the data collected by the sensors to the host device, such that the host device processes the data collected by the sensors and the slave device displays the to-be-presented content data based on a data processing result.

14. A power supply control method applied to a connector, the connector comprising a first interface configured to connect a host device; a second interface configured to connect a slave device; a third interface configured to connect a power supply device; a switch circuit connected to the first interface, the second interface, and the third interface; a power supply device control circuit connected to the third interface; and an interface control circuit connected to the switch circuit and the power supply device control circuit, the method comprising:

at the power supply device control circuit, detecting a supply output power of the power supply device in response to detecting that the power supply device is plugged into the third interface;

determining a power supply control command of the power supply device for the host device and the slave device based on comparison between the supply output power and both of a pre-determined charging power for the host device and a pre-determined operating power of the slave device; and sending the power supply control command to the interface control circuit; and at the interface control circuit, in response to receiving the power supply control command, performing on-off control on the switch circuit based on the power supply control command, to control power supply from the power supply device to the host device and the slave device.

15. A connector comprising:

a first interface configured to connect a first device;

a second interface configured to connect a second device;

a third interface configured to connect a power supply device; and a switch circuit connected to the first interface, the second interface, and the third interface; the connector being configured to detect a supply output power of the power supply device in response to detecting that the power supply device is plugged into the third interface, and determine a power supply control command of the power supply device for a first device and a second device based on comparison between the supply output power and both of a pre-determined charging power for the first device and a pre-determined operating power of the second device, the power supply control command being configured to control the switch circuit to be in one of the following states:

a first state in which both the first interface and the second interface are in communication with the third interface;

a second state in which the first interface is in communication with the third interface;

a third state in which the second interface is in communication with the third interface; and a fourth state in which neither the first interface nor the second interface is in communication with the third interface.

16. The connector according to claim 15, further comprising:

a power supply device control circuit connected to the third interface, and is configured to detect the supply output power of the power supply device and determine the power supply control command of the power supply device for the first device and the second device based on the supply output power, the pre-determined charging power for the first device, and the pre-determined operating power of the second device, in response to detecting that the power supply device is plugged into the third interface; and an interface control circuit connected to the switch circuit and the power supply device control circuit, and configured to cause the switch circuit to switch among the states, to control power supply from the power supply device to the first device and the second device, in response to receiving the power supply control command from the power supply device control circuit.

17. The connector according to claim 15, wherein the first device provides a content output to the second device, in the first state, the connector enables the power supply device to supply power to the first device and the second device;

in second state, the connector enables the power supply device to supply power to the first device but not to the second device;

in a third state, the connector enables the power supply device to supply power to the second device but not to the first device; and in a fourth state, the connector enables the power supply device to supply no power to the first device and the second device.

18. The connector according to claim 15, wherein the power supply device control circuit is configured to:

in response to the fact that the supply output power of the power supply device is not less than the sum of the pre-determined charging power for the first device and the pre-determined operating power of the second device, determine the power supply control command to be a first power supply control command, the first power supply control command configured to control the switch circuit to be in the first state;

in response to that the fact the supply output power of the power supply device is less than the sum of the pre-determined charging power for the first device and the pre-determined operating power of the second device and not less than the pre-determined operating power of the second device, determine the power supply control command to be a second power supply control command, the second power supply control command configured to control the switch circuit to be in the second state;

in response to the fact that the supply output power of the power supply device is less than the pre-determined operating power of the second device and not less than the pre-determined charging power for the first device, determine the power supply control command to be a third power supply control command, the third power supply control command configured to control the switch circuit to be in the third state; and in response to the fact that the supply output power of the power supply device is less than the pre-determined charging power for the first device, determine the power supply control command to be a fourth power supply control command, the fourth power supply control command configured to control the switch circuit to be in the fourth state.

19. The connector according to claim 15, wherein the power supply device control circuit is configured to:

in response to the fact that the supply output power of the power supply device is not less than the sum of the pre-determined charging power for the first device and the pre-determined operating power of the second device and that there is a demand for power supply to the first device, determine the power supply control command to be a fifth power supply control command, the fifth power supply control command configured to control the switch circuit to be in the first state;

in response to one of: the fact that the supply output power of the power supply device is not less than the sum of the pre-determined charging power for the first device and the pre-determined operating power of the second device and that there is no demand for power supply to the first device, and the fact that the supply output power of the power supply device is not less than the pre-determined operating power of the second device but less than the sum of the pre-determined charging power for the first device and the pre-determined operating power of the second device, determine the power supply control command to be a sixth power supply control command, the sixth power supply control command configured to control the switch circuit to be in the second state;

in response to the fact that the supply output power of the power supply device is less than the pre-determined operating power of the second device but not less than the pre-determined charging power for the first device and that there is a demand for power supply to the first device, determine the power supply control command to be a seventh power supply control command, the seventh power supply control command configured to control the switch circuit to be in the third state;

in response to one of: the fact that the supply output power of the power supply device is less than the pre-determined operating power of the second device but not less than the pre-determined charging power for the first device and that there is no demand for power supply to the first device, and the fact that the supply output power of the power supply device is less than the pre-determined charging power for the first device, determine that the power supply control command is an eighth power supply control command, the eighth power supply control command configured to control the switch circuit to be in the fourth state.

20. The connector according to claim 15, wherein the power supply device control circuit is configured to:

in response to the fact that the supply output power of the power supply device is not less than the sum of the pre-determined charging power for the first device and the pre-determined operating power of the second device, determine the power supply control command to be a first power supply control command, the first power supply control command configured to indicate that power to be supplied to both the first device and the second device;

in response to that the fact the supply output power of the power supply device is less than the sum of the pre-determined charging power for the first device and the pre-determined operating power of the second device and not less than the pre-determined operating power of the second device, determine the power supply control command to be a second power supply control command, the second power supply control command configured to indicate that power to be supplied to the second device but not to the first device;

in response to the fact that the supply output power of the power supply device is less than the pre-determined operating power of the second device and not less than the pre-determined charging power for the first device, determine the power supply control command to be a third power supply control command, the third power supply control command configured to indicate that power to be supplied to the first device but not to the second device; and in response to the fact that the supply output power of the power supply device is less than the pre-determined charging power for the first device, determine the power supply control command to be a fourth power supply control command, the fourth power supply control command configured to indicate that no power to be supplied to the first device and the second device.

* * * * *